US007671688B2

(12) United States Patent
Marques

(10) Patent No.: US 7,671,688 B2
(45) Date of Patent: *Mar. 2, 2010

(54) REFERENCE-LESS CLOCK CIRCUIT

(75) Inventor: Augusto Marques, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/032,407

(22) Filed: Feb. 15, 2008

(65) Prior Publication Data

US 2008/0136538 A1    Jun. 12, 2008

Related U.S. Application Data

(63) Continuation of application No. 11/277,600, filed on Mar. 27, 2006, now Pat. No. 7,332,975.

(60) Provisional application No. 60/777,146, filed on Feb. 27, 2006.

(51) Int. Cl.
G01R 23/00 (2006.01)
H03B 1/00 (2006.01)
H03L 1/00 (2006.01)
H03L 1/02 (2006.01)

(52) U.S. Cl. .............................. 331/44; 331/65; 331/66; 331/74

(58) Field of Classification Search .................. 331/18, 331/44, 65–66, 74–75, 177 R, 179
See application file for complete search history.

(56) References Cited

U.S. PATENT DOCUMENTS 4,646,035 A    2/1987    Chapelle
5,451,912 A    9/1995    Torode
5,912,595 A    6/1999    Ma et al.
6,154,095 A    11/2000   Shigemori et al.

(Continued)

FOREIGN PATENT DOCUMENTS

JP    64000599 A  *  1/1989

OTHER PUBLICATIONS

Lin, Yu-Wei et al., "60-MHz Wine-Glass Micromechanical-Disk Reference Oscillator," 2004 IEEE International Solid-State Circuits Conf., Session 17, MEMS and Sensors, 17.7, Jun. 2004, 10 pages.
Sundaresan, Krishnakumar, et al., "Process and Temperature Compensation in a 7-MHz CMOS Clock Oscillator," IEEE Journal of Solid-State Circuits, vol. 41, No. 2, Feb. 2006, pp. 433-442.

(Continued)

*Primary Examiner*—David Mis
(74) *Attorney, Agent, or Firm*—Zagorin O'Brien Graham LLP

(57) ABSTRACT

A programmable reference-less oscillator provides a wide range of programmable output frequencies. The programmable reference-less oscillator is implemented on an integrated circuit that includes a free running controllable oscillator circuit such as a voltage controlled oscillator (VCO), a programmable divider circuit coupled to divide an output of the controllable oscillator circuit according to a programmable divide value. A non-volatile storage stores the programmed divide value and a control word that controls the output of the controllable oscillator circuit. The control word provides a calibration capability to achieve a desired output frequency in conjunction with the programmable divider circuit. Open loop temperature compensation is achieved by adjusting the control word according to a temperature detected by a temperature sensor on the integrated circuit. Additional clock accuracy may be achieved by adjusting the control word for process as well as temperature.

11 Claims, 3 Drawing Sheets

U.S. PATENT DOCUMENTS

| | | |
|---|---|---|
| 6,850,125 B2 | 2/2005 | Norman et al. |
| 7,148,763 B2 | 12/2006 | Sutardja |
| 2004/0232995 A1 | 11/2004 | Thomsen et al. |
| 2005/0040904 A1* | 2/2005 | Sakurai ..................... 331/176 |
| 2005/0270848 A1 | 12/2005 | Chae et al. |
| 2006/0071727 A1* | 4/2006 | Brennan et al. ............. 331/158 |

OTHER PUBLICATIONS

Abidi, Asad A., "RF CMOS Comes of Age," IEEE Journal of Solid-State Circuits, vol. 39, No. 4, Apr. 2004, pp. 549-561.

International Search Report and Written Opinion mailed Nov. 21, 2008 in App. No. PCT/US07/62850, 6 pages.

* cited by examiner

REFERENCE-LESS CLOCK CIRCUIT

CROSS-REFERENCE TO RELATED APPLICATION(S)

This application is a continuation of U.S. patent application Ser. No. 11/277,600, filed Mar. 27, 2006, entitled "Reference-Less Clock Circuit," naming Augusto Marques as inventor, which application claims the benefit of provisional application 60/777,146, filed Feb. 27, 2006, naming Augusto Marques as inventor and entitled "Crystal-less Clock Circuit," which applications are incorporated herein by reference in their entirety.

BACKGROUND

1. Field of the Invention

The invention relates to oscillator circuits and more particularly to oscillator circuits operating without a reference source such as a crystal.

2. Description of the Related Art

A significant percentage of the clock chips offered in the market today are crystal oscillator based. These solutions can normally achieve very good frequency stability, e.g., on the order of ±10 parts per million (ppm). However, such clock chips demand the use of a crystal and need hermetic packaging, which creates additional expense. Furthermore, not all applications require that type of frequency accuracy.

SUMMARY

Accordingly, the invention provides in one aspect a programmable reference-less oscillator circuit that provides a wide range of programmable output frequencies. The programmable reference-less oscillator may be implemented on an integrated circuit that includes a controllable oscillator such as a voltage controlled oscillator (VCO) arranged in an open loop configuration. A programmable divider circuit is coupled to divide an output of the controllable oscillator circuit according to a programmable divide value. A non-volatile storage stores the programmed divide value and a control word that controls the output of the controllable oscillator circuit. The control word provides a calibration capability to achieve a desired output frequency in conjunction with the programmable divider circuit. Open loop temperature compensation is achieved by adjusting the control word according to a temperature detected by a temperature sensor on the integrated circuit.

In an embodiment, a method is provided for operating an integrated circuit. The method includes determining a control signal for a controllable oscillator, at least in part, according to a stored value in a non-volatile memory, supplying the control signal to the controllable oscillator, thereby determining an output of the controllable oscillator, and dividing the output of the controllable oscillator in a divider circuit. A divide value for the divider circuit may also be stored in the non-volatile memory. Open loop temperature compensation is provided by adjusting the control signal according to a temperature sensed in a temperature sensing circuit. The method may further include adjusting the control signal according to both the detected temperature and one or more process parameters associated with the integrated circuit.

In another embodiment a method is provided for making a reference-less oscillator that provides a selected output frequency. The method includes programming a divide value for a divider circuit that divides an output of a controllable oscillator circuit, the output signal of the divider circuit having a frequency that differs from the selected output frequency. A control value that controls the output of the controllable oscillator circuit is varied until the output from the divider circuit is the selected output frequency. That control value is stored in non-volatile memory. The divide value is also stored in the non-volatile memory. The method may further include storing information in the non-volatile memory relating to adjusting the control value according to a detected temperature. The method may further include storing a temperature detected by a temperature sensor of the reference-less oscillator at the time the reference-less oscillator is supplying the selected output frequency.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

There are a large number of applications utilizing clock chips for which an accuracy of ±100 ppm is sufficient. Described herein is an architecture to build a clock chip, without using a reference source such as a crystal or surface acoustic wave (SAW) oscillator, that can achieve suitable accuracy on a fully integrated silicon solution, without the requirement for hermetic packaging and that can be manufactured at a very low cost. In one preferred embodiment, the die size is small (e.g., <0.5 mm$^2$). A preferred embodiment may also include low pin counts and be compatible with existing crystal oscillator packages and pin-outs. For example, in an embodiment the integrated circuit may have VDD, GND, XOUT and ENABLE pins, where VDD and GND are power and ground, respectively, XOUT is the clock out signal, and ENABLE enables the clock out signal. Note that term "pin" is used to generically refer to any sort of connection provided between the integrated circuit and an external signal. Other embodiments may have additional or few input and output pins.

Some embodiments may utilize one of those pins, e.g., the ENABLE pin, for serial communication with the crystal-less oscillator circuit for programming/calibration purposes. Other embodiments may provide a separate serial communication port. For example, an embodiment may provide a separate serial communication including SCLK, SDI and SEN, where SCLK, SDI, and SEN are serial port clock, data, and enable signals, respectively. Any other suitable one-pin or multi-pin serial communication port may be utilized.

In addition, it is possible utilizing the teachings herein to provide one die capable of generating all frequencies within a particular range, e.g., up to a few hundred MHz. Furthermore, the architecture presented herein allows the output frequency to be digitally defined or controlled instead of requiring a different crystal for different frequencies. The clock frequencies may be determined at the factory and stored in non-volatile memory.

Figure 1:
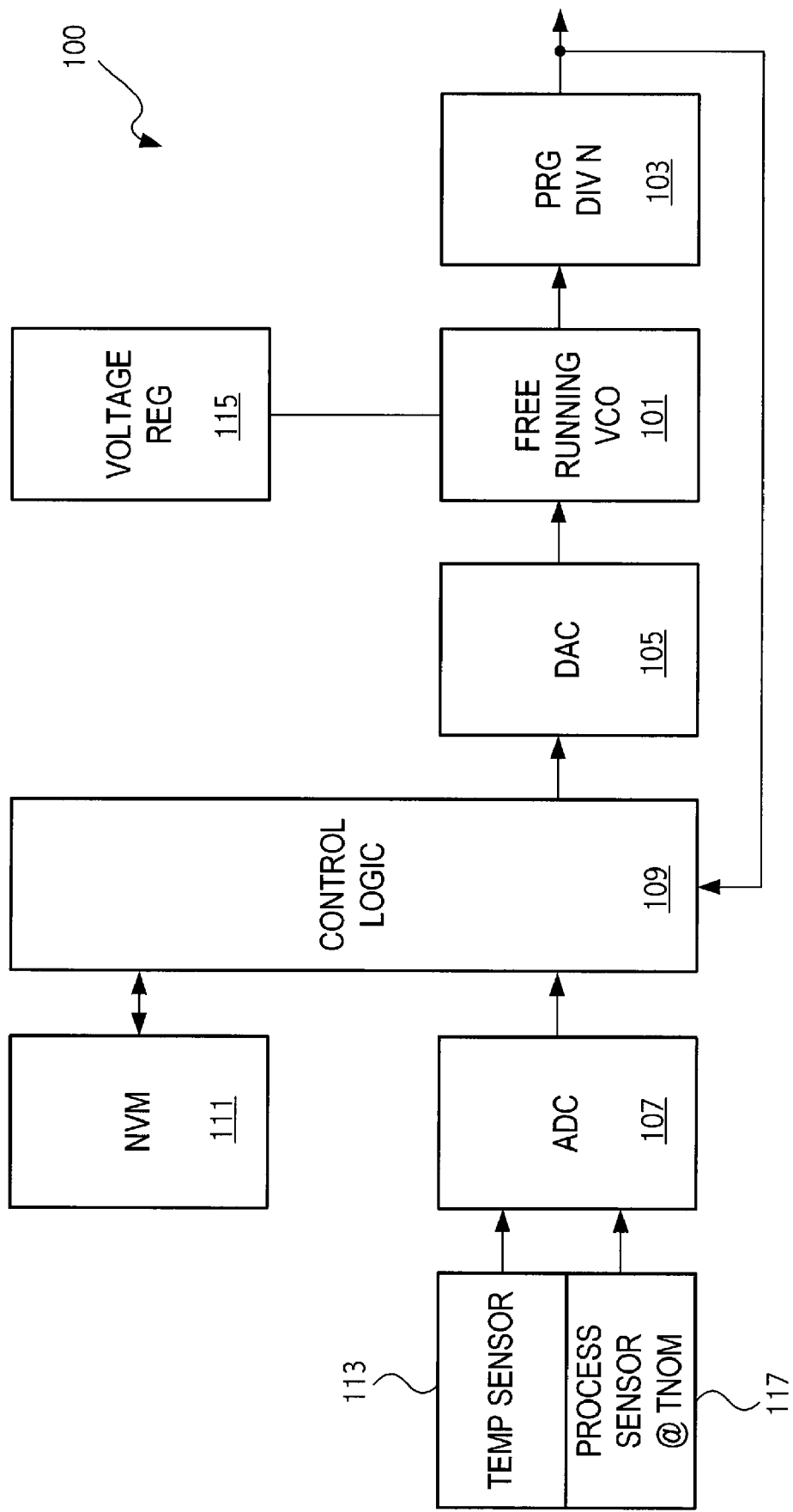
FIG. 1 illustrates a block architecture diagram of a reference-less oscillator according to an embodiment of the invention.

FIG. 1 illustrates a block diagram of a reference-less clock chip 100 according to the embodiment of the invention. At the core of the system is a free running voltage controlled oscillator (VCO) 101 temperature compensated in an open loop configuration. The VCO 101 supplies its output to a programmable divider circuit 103. The illustrated embodiment includes a voltage regulator circuit 115 providing a stable power supply to the VCO 101. A digital to analog converter (DAC) 105 receives a control word from control logic 109 to fine tune the output of the free running VCO 101. The value of that control word is determined during calibration and stored in non-volatile memory 111. The value of that control word may be modified based on temperature during operation. Temperature sensor 113 supplies a sensed temperature value to analog to digital converter 107, which converts the sensed temperature to a digital value. The digital value representing the sensed temperature is used to adjust the control word supplied to DAC 105. Various types of oscillators may be used as the free running oscillator 101. One embodiment utilizes a bond wire LC based oscillator circuit. Another embodiment may utilize an integrated inductor LC based VCO. An RC based VCO architecture or a ring oscillator based architecture may also be used. Thus, the free running oscillator 101 is a controllable oscillator, typically a VCO, but other suitable oscillators may be utilized. The controllable oscillator may be incorporated directly into the die or a portion of the oscillator (e.g., the inductor or a portion thereof) may be formed external to the die and included in the packaged integrated circuit.

Figure 2:
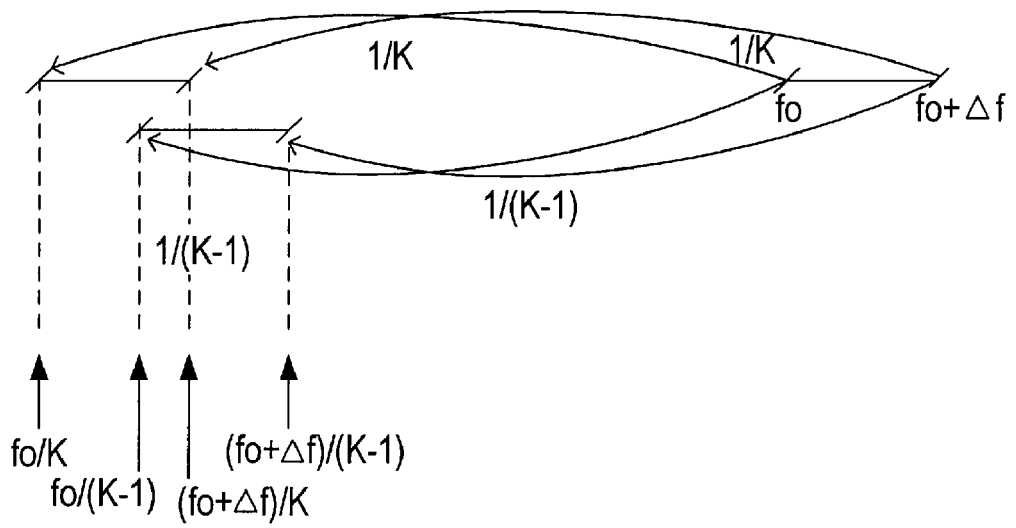
FIG. 2 illustrates how all frequencies within a range can be achieved.

The VCO 101 can operate from a frequency (fo) to (fo+$\Delta$f), where $\Delta$f represents the tuning range. By dividing down, one can generate frequencies (fo/N) to (fo+$\Delta$f)/N. If N is made programmable, then one can potentially generate all possible frequencies within a particular range. With reference to FIG. 2, in order to generate all possible frequencies, the tuning ranges need to overlap: fo/(K−1)$\leq$(fo+$\Delta$f)/K. That is $\Delta$f/fo$\geq$1/(K−1). So in order to have a small VCO tuning range, which simplifies the VCO, a large K, i.e., a large divider value N, is desirable, and therefore a high VCO frequency. For example, in an exemplary embodiment, the voltage controlled oscillator (VCO) is run at 3 GHz and it is desired to generate up to 100 MHz output clocks from oscillator circuit 100. The minimum divide value N is therefore 3000 (MHz)/100 MHz=30. That yields a tuning range $\Delta$f/f$\geq$1/30 or 3.33% (or ±1.67%).

In order to program the output frequency for a particular die, a divide value N is selected to reach the desired frequency (within the tuning range). For a given frequency output desired, the control logic 109 can count cycles in a given period of time and determine the VCO frequency (minimum and maximum). For example, assume the output of the VCO is nominally 4 GHz. A known clock can be supplied to the control logic, and the control logic 109 counts VCO output cycles (or a divided down version of the VCO output). Since the frequency of the clock supplied to the control logic is known, the number of VCO cycles counted by the control logic during a given time period, e.g. in the millisecond range, can be used to determine the VCO output frequency. It is then possible to select a divider value (N) for the programmable divider 103 to achieve the target oscillation frequency so that the output frequency is close to the desired one. That value of N can be stored in non-volatile memory (NVM). The non-volatile memory can be formed using any suitable non-volatile storage technology, including one time programmable memory. However, even once N has been determined, the exact frequency may not have been achieved, although the frequency determined by N is within tuning range $\Delta$f of the VCO. Thus, because the frequency is very close but not exact, a fine "calibration" needs to be performed that can achieve the target frequency. In addition, it is also necessary to ensure that the target frequency can be achieved at all temperatures. To accomplish temperature compensation, an open loop compensation approach is utilized as discussed herein.

Figure 3:
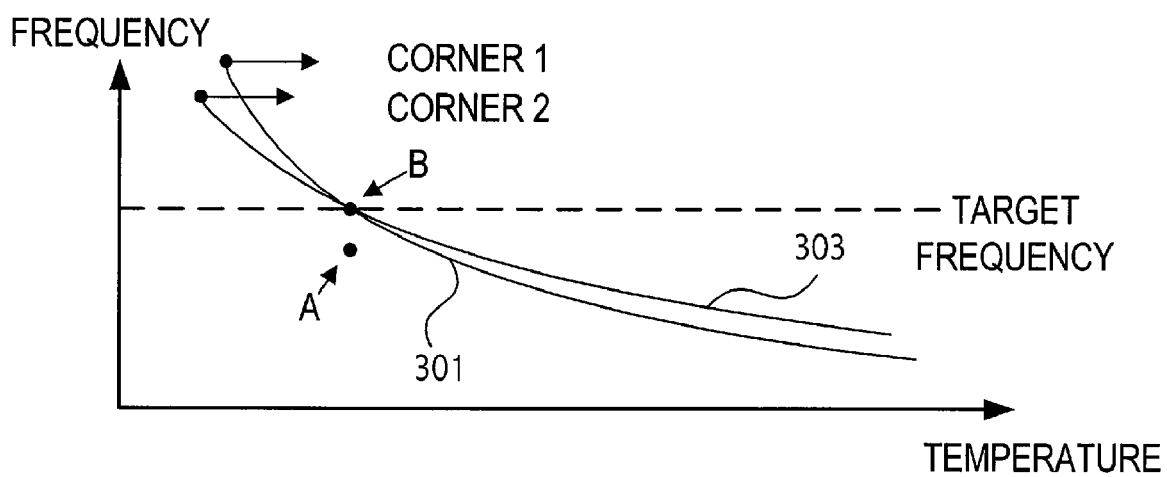
FIG. 3 shows a graph of frequency versus temperature versus process illustrating various aspects of calibration and temperature compensation as well as process variations associated with embodiments of the invention.

Referring to FIG. 3, note that after defining the N value, the oscillation frequency is at point A, very close to the desired target frequency (at B). So in a factory environment, for example, the frequency is steered from point A to point B by driving a digital word through the DAC to change the VCO frequency. That is, the digital word needs to move the frequency to the target oscillation frequency at the factory calibration temperature. The same approach for fine calibration can be used as described above for the calibration of N. That is, the control logic 109 can count output cycles of the VCO over a known time period until the desired frequency is achieved. Once that digital control word is determined for the VCO, the word is stored in NVM 111 and the corresponding temperature as measured by the temperature sensor on chip is also stored. There are many other calibration approaches that would be readily apparent to those of skill in the art. For example, the output frequency could be measured externally and the divider value N for coarse tuning and the control value supplied to the DAC 105 for fine tuning can be supplied over the serial interface. Note that the calibration can be performed at two or more temperatures for even better accuracy.

In order to achieve a higher output clock accuracy than available from the free running VCO in an open loop configuration alone, an open loop temperature compensation scheme is utilized. Consider the profile of frequency vs. temperature vs. process in FIG. 3. As a function of temperature, the integrated circuit will have a profile of temperature and frequency. That profile is illustrated by either of the two curves 301 and 303, which represent different process corners. That profile can be characterized and stored in the NVM 111. In normal operation the temperature sensor 113 senses the temperature and supplies an analog value representative of that temperature to analog to digital converter (ADC) 107. The ADC 107 supplies the digital representation of the temperature to the control logic 109, which utilizes the digital value to read the proper compensation factor out of NVM 111 and apply that value to the DAC 105 to steer the VCO frequency to the right target. With this temperature compensation approach, the frequency should be constant over temperature, or more precisely, constant within an exemplary target range of ±100 ppm. Note that the compensation scheme may store a table of temperature vs. frequency compensation in the non-volatile memory or/and store a fitting equation that allows calculation of the temperature correction to be applied to the VCO.

Thus, during normal operation, open loop frequency compensation is used to account for temperature variations. That is, during normal operation, the control logic supplies the appropriate value of the digital word determined during calibration to finely compensate to the desired output frequency along with any correction factors determined based on the sensed temperature to the DAC 105. That value is supplied to the free running VCO 101. In addition, the value of N stored in NVM is utilized by the programmable divide by N circuit 103. Note that open loop frequency compensation can be done at a relatively low frequency/rate since it only needs to follow the temperature which is a slowly changing variable. In one embodiment, the control logic 109 is implemented by a microcontroller such as an 8052 microcontroller.

Figure 4:
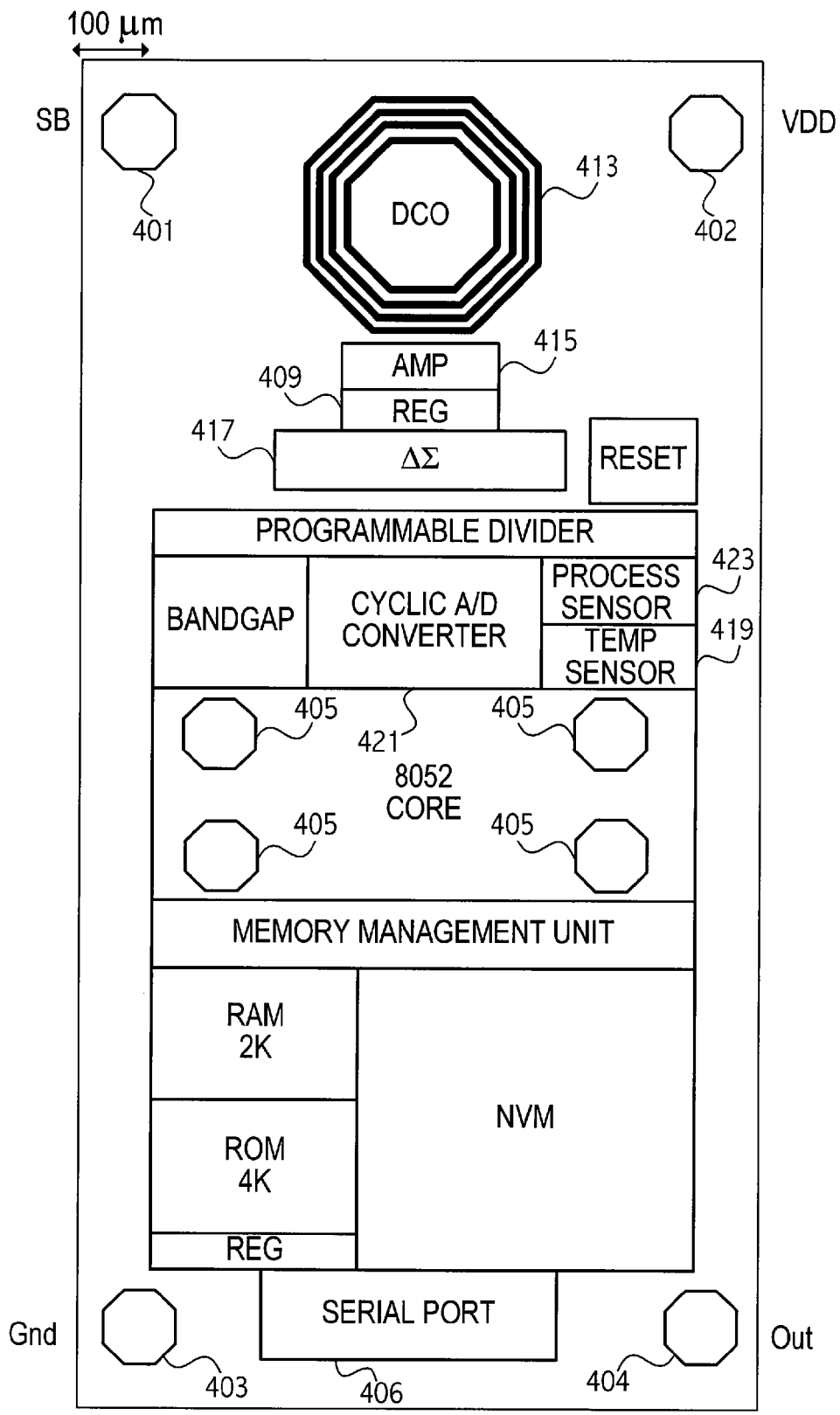
FIG. 4 illustrates a floor plan of an exemplary oscillator circuit according to an embodiment of the invention.

FIG. 4 illustrates a floor plan of an embodiment in which an 8052 microcontroller is utilized for the control logic portion 109 of oscillator circuit 100. The embodiment illustrated in FIG. 4 includes pads 401, 402, 403, and 404 for SB (standby or enable), VDD, GND, and OUT, respectively. In addition, pads 405 are provided in the 8052 microcontroller for programming/control of the 8052 through, e.g., serial port 406. The digitally controlled oscillator includes inductor 413 and the amplifier 415. The regulator 409 provides power regulation for the VCO. The digital to analog converter for the control value for the VCO is provided by delta sigma converter 417. The analog to digital converter for the temperature sensor 419 is provided by cyclic A/D converter 421. The use of the process sensor 423 is described further herein.

There are two important assumptions associated with the temperature compensation. The first is that the temperature/frequency compensation is a deterministic, i.e., not random, function. Indeed, this should be the case since the frequency should only depend on physical parameters that do not have "random" components. First order in an LC oscillator, for example, depends on the inductance L (geometrically determined) and on the capacitance C (mostly geometrically determined). So the most important parameters end up being the thermal expansion coefficient of materials. As an example, in certain implementations LC VCOs typically achieve on the order of 20 ppm/° C. in a very systematic manner, which can be compensated for with the temperature compensation scheme described above. Note that 20 ppm/° C. implies 2000 ppm/100° C. or ±1000 ppm over 100° C. Assuming one can achieve compensation by a factor of 10 using the temperature compensation scheme described herein, that leaves an uncompensated frequency error of about ±100 ppm over 100° C.

The second assumption is that the compensation is process insensitive. However, that might not be completely the case. For example, in an LC, the C will depend somewhat on the process corner. However, most of the dependency is still process insensitive. Referring again to FIG. 3, the fact that temperature sensitivity may be process dependent is illustrated by the two curves 301 and 303 for two process corners. Note that while the illustrated curves intersect at the target frequency, other process curves that may be utilized may intersect at a different location other than the target frequency or not intersect at all. If one understands the physical dependence on the process corner (and often one does understand), then the temperature compensation approach can be extended to include a "process sensor" of the relevant parameter that is process dependent and use a somewhat more complex lookup table stored in NVM or some correction factors to improve the compensation code that may be executed on the microcontroller. That is, process sensing can be used to further refine frequency compensation based either on physical understanding of frequency vs. process parameters or entirely on the basis of an extensive characterization of the process.

In an exemplary embodiment, a process sensor (or sensors) 117 senses the one or more process parameters, e.g., one or more threshold voltages at nominal temperature. The sensed process parameters are utilized to determine additional refinements to the temperature compensation. Other embodiments may include additional sensors related to the capacitance (e.g., oxide associated with the capacitors), resistance of interconnects or circuit elements, mobility, or other process dependent parameters of interest. The particular sensors utilized depend on the processes utilized and the determination of the importance of correcting for any particular process variation. By characterizing the appropriate process, the particular oscillator circuit can be temperature compensated more accurately, e.g., by compensating for temperature changes in accordance with the appropriate curve 301 or 303.

Process compensation is just one incremental improvement to the overall concept to get even better frequency accuracy. Various embodiments might decide to use it or not, depending on the specific application or hardware implementation of the reference-less oscillator described herein.

Thus, various embodiments have been described for implementing a reference-less oscillator circuit. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An integrated circuit die for generating a clock signal comprising:
   a controllable oscillator in the integrated circuit die arranged in an open loop configuration;
   a programmable divider circuit coupled to divide an output of the controllable oscillator according to a programmable divide value to generate the clock signal;
   control logic coupled to determine an output frequency of the controllable oscillator according to a control word stored in a non-volatile storage and a detected temperature; and
   wherein the divide value for the programmable divider circuit is stored in the non-volatile storage.

2. The integrated circuit as recited in claim 1 wherein the integrated circuit is programmable to supply a frequency in a continuous frequency range, the controllable oscillator operable in a frequency range from a first frequency $f_1$ to a second frequency $f_2$, $f_1 < f_2$, where a difference between the first frequency and the second frequency is a positive number $\Delta f$, which represents a tuning range of the controllable oscillator, and wherein a minimum value for the programmable divide value of the divider circuit is greater than or equal to $f_1/\Delta f$.

3. The integrated circuit as recited in claim 1 wherein the integrated circuit is programmable to supply a frequency in a continuous frequency range, the continuous frequency range being at least 100 MHz.

4. The integrated circuit as recited in claim 1 wherein the controllable oscillator comprises one of an integrated inductor LC based voltage controlled oscillator circuit, an RC based voltage controlled oscillator and a ring oscillator.

5. The integrated circuit as recited in claim 1 wherein the integrated circuit includes a microcontroller.

6. The integrated circuit as recited in claim 1 further comprising:
   temperature sensor to detect a temperature and supply an indication thereof;
   an analog to digital converter coupled to the temperature sensor and to supply a digital indication of the detected temperature to the control logic.

7. The integrated circuit as recited in claim 6 wherein the control logic is coupled to adjust the output frequency of the controllable oscillator according to the detected temperature.

8. A reference-less oscillator comprising:
   a controllable oscillator circuit arranged in an open loop configuration in an integrated circuit;
   means in the integrated circuit for dividing an output of the controllable oscillator circuit according to a programmed divide value;

a non-volatile storage in the integrated circuit storing a control word and the programmed divide value, a frequency of the output of the controllable oscillator circuit determined, at least in part, according to a value of the control word; and means in the integrated circuit for adjusting the output of the controllable oscillator circuit according to temperature.

9. A method of making a reference-less oscillator circuit that provides a selected output frequency comprising:

programming a divide value for a divider circuit coupled to divide a first output signal from a controllable oscillator circuit, a second output signal from the divider circuit having a frequency that differs from the selected output frequency, wherein the controllable oscillator circuit can operate from a frequency of (fo) to (fo+$\Delta$f), $\Delta$f represents a tuning range of the controllable oscillator circuit, and wherein a minimum divide value (K-1) for the divider satisfies $\Delta f/f_0 \geqq 1/(K-1)$;

varying a control value that controls the first output signal from the controllable oscillator circuit until the second output signal from the divider circuit is the selected output frequency;

storing a control signal corresponding to generation of the selected output frequency in non-volatile memory;

storing information in the non-volatile memory relating to adjusting the control value according to a detected temperature; and storing the divide value in the non-volatile memory.

10. The method as recited in claim 9 further comprising storing a temperature detected by a temperature sensor of the reference-less oscillator circuit at the time the reference-less oscillator is supplying the selected output frequency.

11. The method as recited in claim 9 wherein the reference-less oscillator circuit is programmable to supply a frequency in a continuous frequency range, the continuous frequency range being at least 100 MHz.

* * * * *